United States Patent
Hsieh et al.

(10) Patent No.: US 10,720,580 B2
(45) Date of Patent: Jul. 21, 2020

(54) RRAM DEVICE AND METHOD OF FABRICATION THEREOF

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Yi Jiang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 32 days.

(21) Appl. No.: 16/166,827

(22) Filed: Oct. 22, 2018

(65) Prior Publication Data

US 2020/0127197 A1    Apr. 23, 2020

(51) Int. Cl.
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/146* (2013.01); *H01L 45/16* (2013.01); *H01L 45/1608* (2013.01); *H01L 45/145* (2013.01); *H01L 45/1675* (2013.01)

(58) Field of Classification Search
CPC . H01L 45/1253; H01L 45/145; H01L 45/146; H01L 45/16; H01L 45/1608; H01L 45/1675; H01L 27/2463
See application file for complete search history.

(56) References Cited

U.S. PATENT DOCUMENTS

| | | | | |
|---|---|---|---|---|
| 9,368,395 B1* | 6/2016 | Wei | | H01L 21/76805 |
| 9,431,603 B1* | 8/2016 | Hsieh | | H01L 45/04 |
| 10,003,022 B2 | 6/2018 | Liu et al. | | |
| 10,050,194 B1* | 8/2018 | Nardi | | H01L 27/2436 |
| 10,516,106 B2* | 12/2019 | Chu | | H01L 45/1246 |
| 2007/0170413 A1* | 7/2007 | Matsui | | H01L 45/06 257/3 |
| 2008/0173975 A1* | 7/2008 | Chen | | H01L 27/2463 257/529 |
| 2009/0065941 A1* | 3/2009 | La Tulipe, Jr. | ... | H01L 21/76802 257/761 |
| 2009/0068835 A1* | 3/2009 | La Tulipe, Jr. | ...... | H01L 23/481 438/656 |
| 2013/0140515 A1* | 6/2013 | Kawashima | ......... | H01L 45/085 257/4 |
| 2014/0118020 A1* | 5/2014 | Filippi | ............... | G01R 31/2884 324/762.01 |

(Continued)

*Primary Examiner* — Victoria K. Hall
(74) *Attorney, Agent, or Firm* — Ditthavong & Steiner P. C.

(57) ABSTRACT

A device including a reduced top RRAM electrode structure, and method of production thereof. Embodiments include a bottom resistive random-access memory (RRAM) electrode structure over a plurality of lower metal level contacts formed laterally separated in a substrate; a resistive switching structure over the bottom RRAM electrode structure; a top RRAM electrode structure over the resistive switching structure; a protective structure over the top RRAM electrode structure; an encapsulation structure over the bottom RRAM electrode structure and on sidewalls of the resistive switching structure, the top RRAM electrode structure and the protective structure; and an Nblock layer over the substrate.

20 Claims, 8 Drawing Sheets

(56) References Cited

U.S. PATENT DOCUMENTS

| | | | | |
|---|---|---|---|---|
| 2014/0166961 | A1* | 6/2014 | Liao | H01L 45/1253 |
| | | | | 257/4 |
| 2014/0252295 | A1* | 9/2014 | Liao | H01L 45/04 |
| | | | | 257/2 |
| 2015/0194602 | A1* | 7/2015 | Liao | H01L 45/146 |
| | | | | 257/4 |
| 2015/0255718 | A1* | 9/2015 | Liu | H01L 45/122 |
| | | | | 257/4 |
| 2015/0263279 | A1* | 9/2015 | Hayakawa | H01L 45/1253 |
| | | | | 257/4 |
| 2016/0043143 | A1* | 2/2016 | Sakotsubo | H01L 27/2409 |
| | | | | 257/4 |
| 2016/0218283 | A1* | 7/2016 | Trinh | H01L 45/08 |
| 2016/0225986 | A1* | 8/2016 | Hsu | H01L 27/2463 |
| 2016/0240586 | A1* | 8/2016 | Masuoka | H01L 45/06 |
| 2016/0268341 | A1* | 9/2016 | Nazarian | H01L 27/2463 |
| 2016/0268505 | A1* | 9/2016 | Sung | H01L 45/1233 |
| 2016/0276586 | A1* | 9/2016 | Trinh | H01L 45/1253 |
| 2016/0365512 | A1* | 12/2016 | Sung | H01L 45/146 |
| 2017/0186814 | A1* | 6/2017 | Hung | H01L 27/2463 |
| 2017/0243919 | A1* | 8/2017 | Seong | H01L 45/144 |
| 2018/0301626 | A1* | 10/2018 | Trinh | H01L 45/1253 |
| 2019/0074440 | A1* | 3/2019 | Yang | H01L 45/1253 |
| 2019/0115392 | A1* | 4/2019 | Bruce | H01L 27/2409 |
| 2019/0165044 | A1* | 5/2019 | Takaki | H01L 27/11551 |
| 2020/0006431 | A1* | 1/2020 | Mayuzumi | H01L 27/224 |
| 2020/0006649 | A1* | 1/2020 | Jiang | H01L 45/085 |
| 2020/0006656 | A1* | 1/2020 | Leobandung | H01L 27/2436 |
| 2020/0106013 | A1* | 4/2020 | Strutt | H01L 27/2436 |

* cited by examiner

RRAM DEVICE AND METHOD OF FABRICATION THEREOF

TECHNICAL FIELD

The present disclosure relates to semiconductor devices, such as integrated circuits (ICs). The present disclosure is particularly applicable to resistive random-access memory (RRAM) devices and methods of fabrication.

BACKGROUND

RRAM devices are promising candidates for next-generation non-volatile memory technology exhibiting various desirable features, such as random accessibility, increased capacity and speed, reduced power consumption, and unlimited reading and writing functions. Furthermore, RRAM devices have a simple structure in which a bottom RRAM electrode structure, a resistive switching structure, and a top RRAM electrode structure may be sequentially stacked. However, certain processes in the fabrication sequence, e.g., etching, are more likely to damage the resistive switching structure, thereby affecting a RRAM's performance.

A need, therefore, exists for RRAM devices structured to prevent damage to the resistive switching structure during etching.

SUMMARY

An aspect of the present disclosure is a device including a reduced top RRAM electrode structure.

Another aspect of the present disclosure is a method of selectively reducing the size of the top RRAM electrode structure.

According to the present disclosure, some technical effects may be achieved in part by a device including: a bottom RRAM electrode structure over one of a plurality of lower metal level contacts formed laterally separated in a substrate; a resistive switching structure over the bottom RRAM electrode structure; a top RRAM electrode structure over the resistive switching structure; a protective structure over the top RRAM electrode structure; an encapsulation structure over the bottom RRAM electrode structure and on sidewalls of the resistive switching structure, the top RRAM electrode structure and the protective structure; and an Nblock layer over the substrate.

Another aspect of the present disclosure is a method including: forming a plurality of lower metal level contacts laterally separated in a silicon (Si) substrate; forming a bottom RRAM electrode structure over one of the plurality of lower metal level contacts; forming a resistive switching structure over the bottom RRAM electrode structure; forming a top RRAM electrode structure over the resistive switching structure; forming a protective structure over the top RRAM electrode structure; forming an encapsulation structure over the bottom RRAM electrode structure and on sidewalls of the resistive switching structure, the top RRAM electrode structure and the protective structure; and forming an Nblock layer over the substrate.

A further aspect of the present disclosure is a device including: a bottom RRAM electrode structure having a thickness of about 5 nanometer (nm) to about 50 nm over one of a plurality of lower metal level contacts formed laterally separated in a Si substrate; a resistive switching structure having a thickness of about 5 nm to about 50 nm and a width of about 40 nm to about 90 nm over the bottom RRAM electrode structure; a top RRAM electrode structure having a thickness of about 5 nm to about 50 nm and a width of about 20 nm to about 60 nm over the resistive switching structure; a protective structure having a thickness of about 80 nm to about 120 nm and a width of about 40 nm to about 90 nm over the top RRAM electrode structure; an encapsulation structure over the bottom RRAM electrode structure and on sidewalls of the resistive switching structure, the top RRAM electrode structure and the protective structure; an Nblock layer over the Si substrate; and an inter-layer dielectric (ILD) over the Si substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of damage to the resistive switching structure attendant upon etching. The problem is solved, inter alia, by selectively reducing the size of the top RRAM electrode structure to protect the resistive switching structure during an etching process.

Methodology in accordance with embodiments of the present disclosure includes forming a plurality of lower metal level contacts laterally separated in a Si substrate. Forming a bottom RRAM electrode structure over one of the plurality of lower metal level contacts. Forming a resistive switching structure over the bottom RRAM electrode structure. Forming a top RRAM electrode structure over the resistive switching structure. Forming a protective structure over the top RRAM electrode structure. Forming an encapsulation structure over the bottom RRAM electrode structure and on sidewalls of the resistive switching structure, the top RRAM electrode structure and the protective structure; and forming an Nblock layer over the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
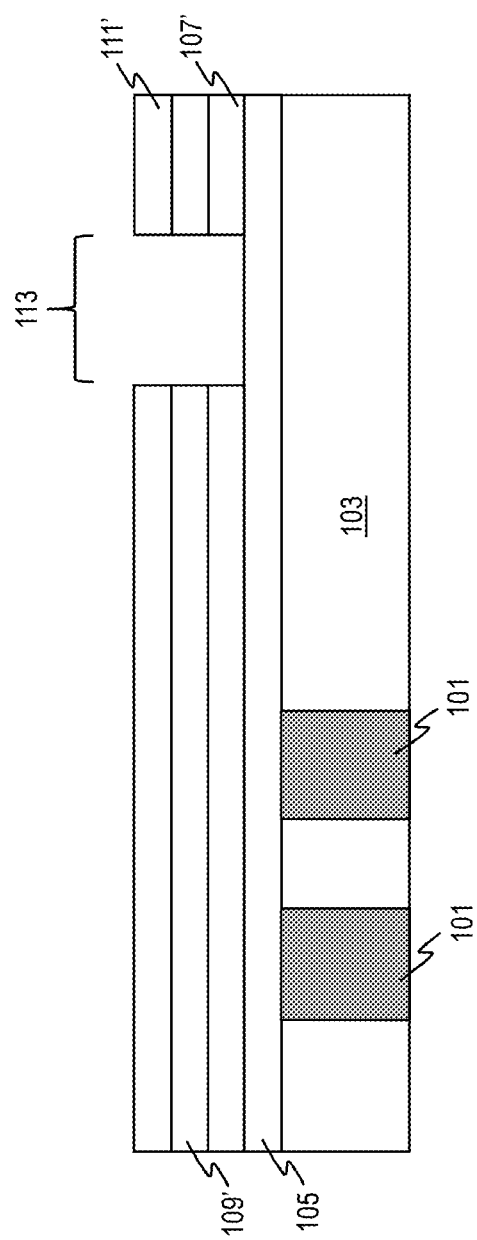
FIGS. 1 through 8 schematically illustrate cross-sectional views of a process flow for selectively reducing the size of the top RRAM electrode structure, in accordance with an exemplary embodiment.

FIGS. 1 through 8 schematically illustrate cross-sectional views of a process flow for selectively reducing the size of the top RRAM electrode structure, in accordance with an exemplary embodiment. Referring to FIG. 1, a plurality of lower metal level contacts 101 is formed, e.g., of copper (Cu) or other functionally similar material, laterally separated in a Si substrate 103. A bottom RRAM electrode layer 105 is formed, e.g., of titanium (Ti), titanium nitride (TiN), tantalum (Ta), tantalum nitride (TaN), tungsten (W), titanium-tungsten (TiW), tungsten nitride (WN), ruthenium (Ru), cobalt (Co), molybdenum (Mo), platinum (Pt), silver (Ag), gold (Au), or other functionally similar material to a thickness of about 5 nm to about 50 nm, over one of the plurality of lower metal level contacts 101 and substrate 103. Subsequently, a resistive switching layer 107 is formed, e.g., of titanium oxide (TiOx), hafnium oxide (HfOx), zirconium oxide (ZrOx), silicon nitride (SiN), tungsten oxide (WOx), silicon dioxide ($SiO_2$), or other functionally similar material to a thickness of about 5 nm to about 50 nm, over bottom RRAM electrode layer 105. Thereafter, a top RRAM electrode layer 109 is formed, e.g., of TiN, Ti, TaN, Ta, W, TiW, WN, Ru, Co, Mo, Pt, Ag, Au, or other functionally similar material to a thickness of about 5 nm to about 50 nm, over resistive switching layer 107. Consequently, a protective layer 111 is formed, e.g., of $SiO_2$, SiN, silicon carbon nitride (SiCN), or other functionally similar material to a thickness of about 80 nm to about 120 nm, over top RRAM electrode layer 109. Thereafter, a portion of protective layer 111, top RRAM electrode layer 109 and resistive switching layer 107 is removed, e.g., by dry etch or other suitable technique, forming an alignment mark opening 113, protective layer 111', top RRAM electrode layer 109' and resistive switching layer 107'.

Figure 2:
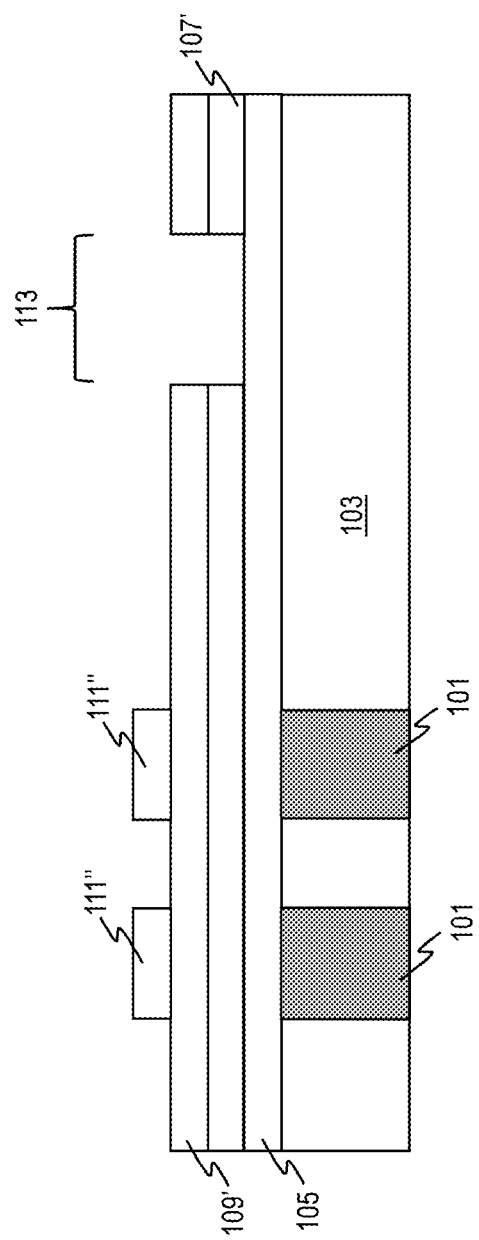
Figure 3:
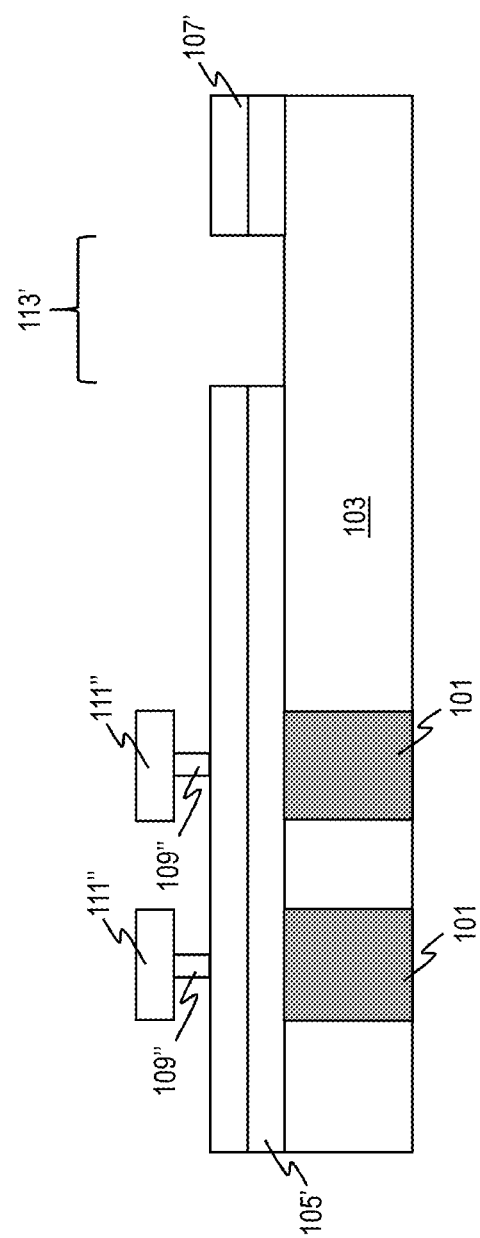

As illustrated in FIG. 2, a portion of protective layer 111' is removed, e.g., by dry etch or other suitable technique, forming protective structure 111" having a width, e.g., of about 40 nm to about 90 nm. As depicted in FIG. 3, a portion of top RRAM electrode layer 109' is removed, e.g., by hydrogen peroxide ($H_2O_2$) wet etch or other suitable technique, forming top RRAM electrode structure 109" having a width, e.g., of about 20 nm to about 60 nm. A portion of bottom RRAM electrode layer 105 is removed during the etching through alignment mark opening 113, thereby forming bottom RRAM electrode layer 105' and alignment mark opening 113'.

Figure 4:
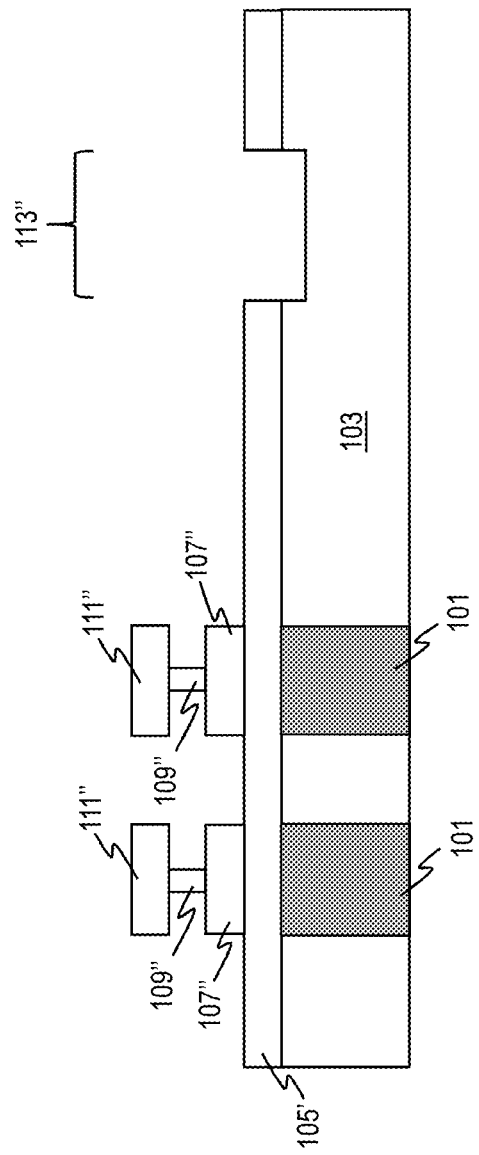

Thereafter, as shown in FIG. 4, a portion of resistive switching layer 107' is removed, e.g., by dry etch or other suitable technique, forming resistive switching structure 107" having a width, e.g., of about 40 nm to about 90 nm. A portion of Si substrate 103 is removed during the etching through alignment mark opening 113', thereby forming alignment mark opening 113".

Figure 5:
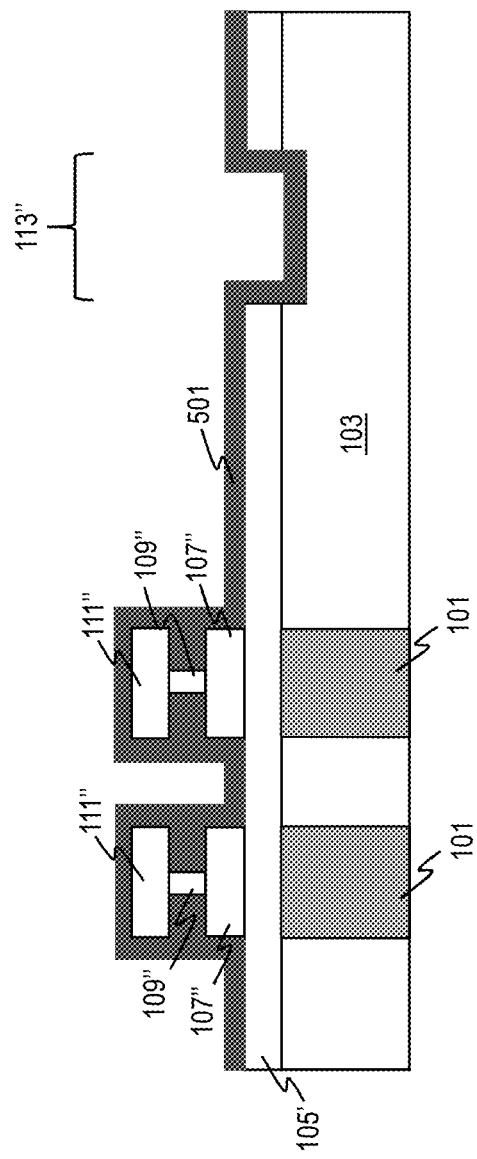
Figure 6:
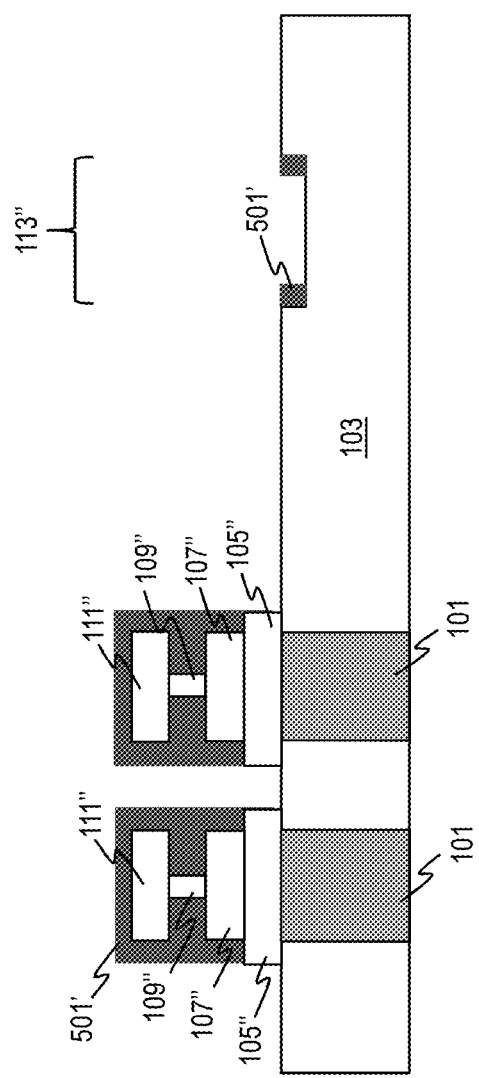

Referring to FIG. 5, an encapsulation layer 501 is conformally formed, e.g., of $SiO_2$, SiN, SiCN, or other functionally similar material to a thickness of about 5 nm to about 20 nm, over Si substrate 103. Subsequently, in FIG. 6, a portion of encapsulation layer 501 is removed, e.g., by dry etch or other suitable technique, forming encapsulation structure 501'. In one embodiment, encapsulation structure 501' is formed on the sidewalls of alignment mark opening 113" having a width, e.g., of about 5 nm to about 20 nm. In another embodiment, encapsulation structure 501' is formed over a portion of bottom RRAM electrode layer 105' enveloping resistive switching structure 107", top RRAM electrode structure 109" and protective structure 111". A portion of bottom RRAM electrode layer 105' is removed during the etching, thereby forming bottom RRAM electrode structure 105". In one embodiment, the lateral surface of bottom RRAM electrode structure 105" is coplanar to the lateral surface of encapsulation structure 501' over bottom RRAM electrode structure 105".

Figure 7:
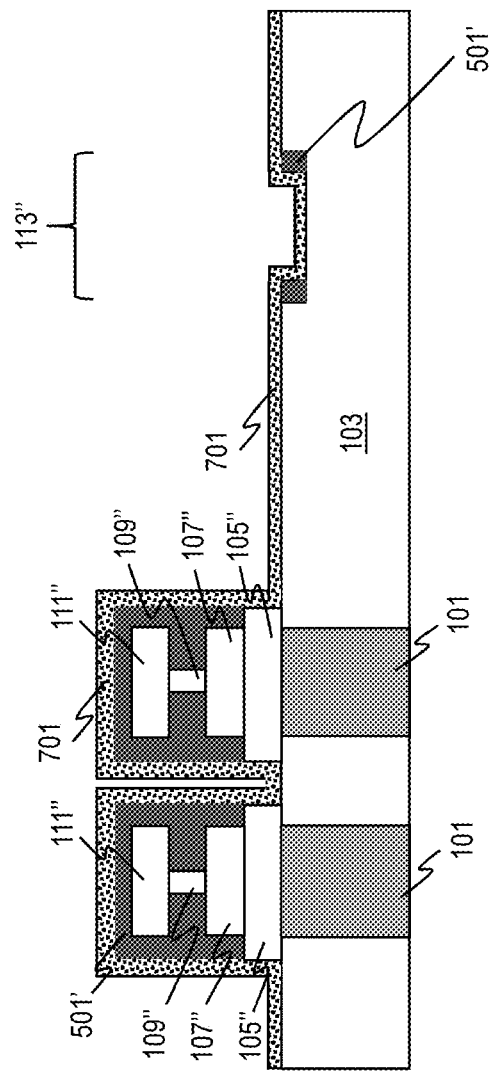
Figure 8:
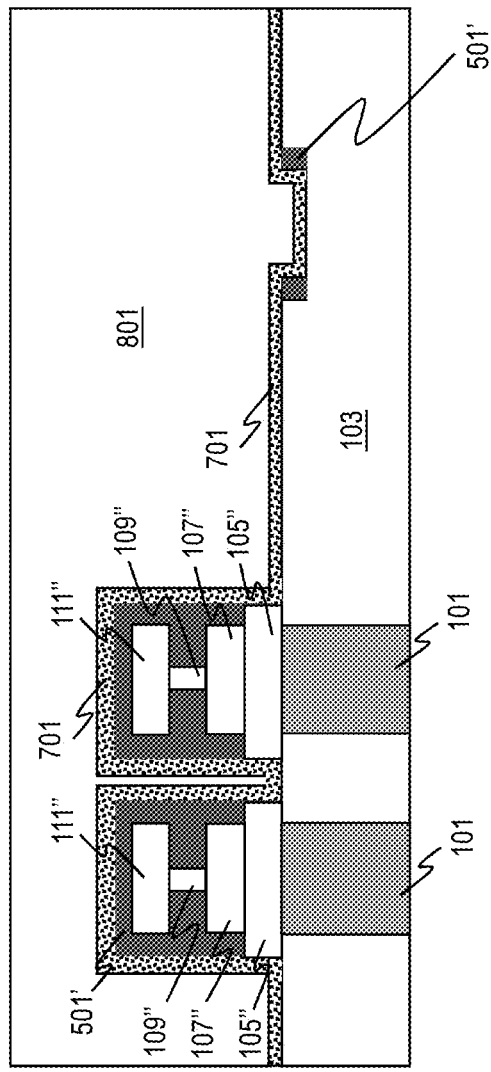

As illustrated in FIG. 7, an Nblock layer 701 is conformally formed, e.g., of SiCN or other functionally similar material to a thickness of about 20 nm to about 50 nm, over Si substrate 103, e.g., by plasma-enhanced chemical vapor deposition (PECVD). Referring to FIG. 8, an ILD 801 is formed over the Nblock layer 701. Subsequently a conventional back end of line (BEOL) process, e.g., a standard Cu dual damascene process, is performed.

The embodiments of the present disclosure achieves several technical effects, such as an improved protection for the resistive switching layer, and an additional lithography process margin. In addition, there is no requirement for a small critical dimension (CD) or any concern regarding Cu contact exposure. Devices formed in accordance with embodiments of the present disclosure enjoy utility in various industrial applications, e.g., microprocessors, smartphones, mobile phones, cellular handsets, set-top boxes, DVD recorders and players, automotive navigation, printers and peripherals, networking and telecom equipment, gaming systems, and digital cameras. The present disclosure, therefore, enjoys industrial applicability in any of various types of highly integrated semiconductor devices and RRAM devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a bottom resistive random-access memory (RRAM) electrode structure over one of a plurality of lower metal level contacts formed laterally separated in a substrate;
    a resistive switching structure over the bottom RRAM electrode structure;
    a top RRAM electrode structure over the resistive switching structure;
    a protective structure over the top RRAM electrode structure;
    an encapsulation structure over the bottom RRAM electrode structure and on sidewalls of the resistive switching structure, the top RRAM electrode structure and the protective structure; and
    an Nblock layer over the substrate.

2. The device according to claim 1, wherein the substrate is a silicon (Si) substrate with an opening laterally separated from the plurality of lower metal level contacts, and wherein the opening comprises:
    a second encapsulation structure on sidewalls; and
    the Nblock layer over the second encapsulation structure and the opening.

3. The device according to claim 2, further comprising: an inter-layer dielectric (ILD) over the Nblock layer.

4. The device according to claim 1, wherein the bottom RRAM electrode structure has a thickness of about 5 nanometer (nm) to about 50 nm.

5. The device according to claim 1, wherein the resistive switching structure has a thickness of about 5 nanometer (nm) to about 50 nm and a width of about 40 nm to about 90 nm.

6. The device according to claim 1, wherein the top RRAM electrode structure has a thickness of about 5 nanometer (nm) to about 50 nm and a width of about 20 nm to about 60 nm.

7. The device according to claim 1, wherein the protective structure has a thickness of about 80 nanometer (nm) to about 120 nm and a width of about 40 nm to about 90 nm.

8. The device according to claim 1, wherein a lateral surface of the bottom RRAM electrode structure is not coplanar to a lateral surface of the resistive switching structure and the protective structure.

9. A method comprising:
forming a plurality of lower metal level contacts laterally separated in a silicon (Si) substrate;
forming a bottom resistive random-access memory (RRAM) electrode structure over one of the plurality of lower metal level contacts;
forming a resistive switching structure over the bottom RRAM electrode structure;
forming a top RRAM electrode structure over the resistive switching structure;
forming a protective structure over the top RRAM electrode structure;
forming an encapsulation structure over the bottom RRAM electrode structure and on sidewalls of the resistive switching structure, the top RRAM electrode structure and the protective structure; and
forming an Nblock layer over the substrate.

10. The method according to claim 9, wherein forming the protective structure comprises:
forming a bottom RRAM electrode layer over the plurality of lower metal level contacts and the substrate;
forming a resistive switching layer over the bottom RRAM electrode layer;
forming a top RRAM electrode layer over the resistive switching layer;
forming a protective layer over the top RRAM electrode structure;
removing a portion of the protective layer, the top RRAM electrode layer and the resistive switching layer, forming an opening; and
patterning the protective layer, forming the protective structure aligned with the plurality of lower metal level contacts.

11. The method according to claim 10, wherein forming the top RRAM electrode structure comprises:
removing a portion of the top RRAM electrode layer, wherein a lateral surface of the top RRAM electrode structure is not coplanar to a lateral surface of the protective structure, and wherein a portion of the bottom RRAM electrode layer is simultaneously removed through the opening.

12. The method according to claim 11, wherein forming the resistive switching structure comprises:
removing a portion of the resistive switching layer, wherein a lateral surface of the resistive switching structure is coplanar to the lateral surface of the protective structure, and wherein a portion of the substrate is simultaneously removed through the opening.

13. The method according to claim 12, wherein forming the bottom RRAM electrode structure comprises:
conformally forming the encapsulation layer over the Si substrate;
removing a portion of the encapsulation layer, forming the encapsulation structure and a second encapsulation structure on sidewalls of the opening; and
removing another portion of the bottom RRAM electrode layer to form the bottom RRAM electrode structure, wherein a lateral surface of the bottom RRAM electrode structure is coplanar to a lateral surface of the encapsulation structure.

14. The method according to claim 13, further comprising:
forming an inter-layer dielectric (ILD) over the Nblock layer.

15. The method according to claim 9, comprising forming the bottom RRAM electrode structure and the top RRAM electrode structure of titanium (Ti), titanium nitride (TiN), tantalum (Ta), tantalum nitride (TaN), tungsten (W), titanium-tungsten (TiW), tungsten nitride (WN), ruthenium (Ru), cobalt (Co), molybdenum (Mo), platinum (Pt), silver (Ag), or gold (Au).

16. The method according to claim 9, comprising forming the resistive switching structure of titanium oxide (TiOx), hafnium oxide (HfOx), zirconium oxide (ZrOx), silicon nitride (SiN), tungsten oxide (WOx), or silicon dioxide ($SiO_2$).

17. The method according to claim 9, comprising forming the protective structure of silicon dioxide ($SiO_2$), silicon nitride (SiN), or silicon carbon nitride (SiCN).

18. The method according to claim 9, comprising forming the encapsulation structure of silicon dioxide ($SiO_2$), silicon nitride (SiN), or silicon carbon nitride (SiCN).

19. A device comprising:
a bottom resistive random-access memory (RRAM) electrode structure having a thickness of about 5 nanometer (nm) to about 50 nm over one of a plurality of lower metal level contacts formed laterally separated in a silicon (Si) substrate;
a resistive switching structure having a thickness of about 5 nm to about 50 nm and a width of about 40 nm to about 90 nm over the bottom RRAM electrode structure;
a top RRAM electrode structure having a thickness of about 5 nm to about 50 nm and a width of about 20 nm to about 60 nm over the resistive switching structure;
a protective structure having a thickness of about 80 nm to about 120 nm and a width of about 40 nm to about 90 nm over the top RRAM electrode structure;
an encapsulation structure over the bottom RRAM electrode structure and on sidewalls of the resistive switching structure, the top RRAM electrode structure and the protective structure;
an Nblock layer over the Si substrate; and
an inter-layer dielectric (ILD) over the Si substrate.

20. The device according to claim 19, wherein the Si substrate has an opening laterally separated from the plurality of lower metal level contacts, and wherein the opening comprises:
a second encapsulation structure on sidewalls; and
the Nblock layer over the second encapsulation structure and the opening.

* * * * *